United States Patent
Lehmann et al.

(10) Patent No.: US 11,293,747 B2
(45) Date of Patent: Apr. 5, 2022

(54) METHOD AND APPARATUS FOR CARRYING OUT A TIME-RESOLVED INTERFEROMETRIC MEASUREMENT

(71) Applicant: Technische Universitaet Berlin, Berlin (DE)

(72) Inventors: Michael Lehmann, Berlin (DE); Tore Niermann, Berlin (DE); Tolga Wagner, Berlin (DE)

(73) Assignee: TECHNISCHE UNIVERSITAET BERLIN, Berlin (DE)

( * ) Notice: Subject to any disclaimer, the term of this patent is extended or adjusted under 35 U.S.C. 154(b) by 272 days.

(21) Appl. No.: 16/493,610

(22) PCT Filed: Feb. 27, 2018

(86) PCT No.: PCT/EP2018/054806
§ 371 (c)(1),
(2) Date: Sep. 12, 2019

(87) PCT Pub. No.: WO2018/166786
PCT Pub. Date: Sep. 20, 2018

(65) Prior Publication Data
US 2020/0103213 A1    Apr. 2, 2020

(30) Foreign Application Priority Data
Mar. 14, 2017    (EP) ..................... 17160812

(51) Int. Cl.
*G01B 9/021*    (2006.01)
*H01J 37/26*    (2006.01)
(Continued)

(52) U.S. Cl.
CPC .......... *G01B 9/021* (2013.01); *G03H 1/0236* (2013.01); *G03H 1/22* (2013.01); *G03H 5/00* (2013.01);
(Continued)

(58) Field of Classification Search
CPC ........ G01B 9/021; H01J 37/26; H01J 37/265; H01J 2237/228; H01J 2237/2614;
(Continued)

(56) References Cited

U.S. PATENT DOCUMENTS

2003/0227658 A1    12/2003    Thomas et al.
2019/0219931 A1*    7/2019    Zwier ................... G03F 9/7049

FOREIGN PATENT DOCUMENTS

EP    1 426 998 A2    6/2004

OTHER PUBLICATIONS

Giulio Pozzi et al.; "Interferometric Methods for Mapping Static Electric and Magnetic Field"; Elsevier; Comptes Rendus Physique; vol. 15; pp. 126-139 (2014).
(Continued)

*Primary Examiner* — Kiet T Nguyen
(74) *Attorney, Agent, or Firm* — Gordon Rees Scully Mansukhani, LLP

(57) ABSTRACT

An embodiment of the invention relates to a method for carrying out a time-resolved interferometric measurement comprising the steps of generating at least two coherent waves, overlapping said at least two coherent waves and producing an interference pattern, measuring the interference pattern for a given exposure time, thereby forming measured interference values, and analyzing the measured interference values and extracting amplitude and/or phase information from the measured interference values. In at least one time segment, hereinafter referred to as disturbed time segment, of the expo-sure time, the interference pattern is intentionally disturbed or destroyed such that the corresponding measured interference values describe a disturbed or destroyed interference pattern. In at least one other time segment, hereinafter referred to as undisturbed time segment, of the exposure time, the interference pattern is (Continued)

undisturbed or at least less disturbed compared to the disturbed time segment such that the corresponding measured interference values describe an undisturbed or less disturbed interference pattern. The measured interference values that were measured during the entire given exposure time, are filtered, wherein those interference values that were measured during the at least one disturbed time segment, are reduced, suppressed or discarded. The filtered interference values are analyzed and the amplitude and/or phase information is extracted from the filtered interference values.

14 Claims, 4 Drawing Sheets

(51) Int. Cl.
*G03H 5/00* (2006.01)
*G03H 1/02* (2006.01)
*G03H 1/22* (2006.01)
G03H 1/26 (2006.01)
G03H 1/00 (2006.01)
G03H 1/04 (2006.01)
G03H 1/18 (2006.01)

(52) U.S. Cl.
CPC ............ *H01J 37/26* (2013.01); *H01J 37/265* (2013.01); *G03H 2001/0094* (2013.01); *G03H 2001/0441* (2013.01); *G03H 2001/187* (2013.01); *G03H 2001/2655* (2013.01); *G03H 2222/20* (2013.01); *G03H 2222/45* (2013.01); *G03H 2240/52* (2013.01); *H01J 2237/228* (2013.01)

(58) Field of Classification Search
CPC ...... G03H 1/0443; G03H 1/0236; G03H 1/22; G03H 2001/2655; G03H 2001/0094; G03H 2001/0441; G03H 2001/187; G03H 5/00; G03H 2222/20; G03H 2222/45; G03H 2240/52
USPC ........................................................ 250/311
See application file for complete search history.

(56) References Cited

OTHER PUBLICATIONS

O. Bostanjoglo et al.; "Nanosecond Electron Microscopes" Elsevier Science B.V.; Ultramicroscopy; vol. 81; pp. 141-147 (2000).

H. Domer et al.; "High-Speed Transmission Electron Microscope"; American Institute of Physics; vol. 74; No. 10; Oct. 2003; pp. 4369-4372.

Ahmed H. Zewail; "Four-Dimensional Electron Microscopy"; Science; vol. 328; Apr. 9, 2010; pp. 187-193.

Armin Feist et al.; "Ultrafast Transmission Electron Microscopy Using a Laser-Driven Field Emitter: Femtosecond Resolution with a High Coherence Electron Beam"; Elsevier; Ultramicroscopy; vol. 176; pp. 63-73 (2017).

G. Mollenstedt et al.; "Beobachtungen und Messungen an Biprisma-Interferenzen mit Elektronenwellen" Zeitschrift Fur Physik; vol. 145; pp. 377-397 (1956).

Hannes Lichte; "Electron Holography: Optimum Position of the Biprism in the Electron Microscope"; Ultramicroscopy; vol. 64; pp. 79-86 (1996).

Hannes Lichte et al.; "Artefacts In Electron Holography"; Elsevier Science B.V; Ultramicroscopy; vol. 64; pp. 67-77 (1996).

Robert L. Powell et al.; "Interferometric Vibration Analysis by Wavefront Reconstruction"; Journal of the Optical Society of America; vol. 55; No. 12; Dec. 1965; pp. 1593-1598.

E. Volkl et al.; "Advanced Electron Holography: A New Algorithm for Image Processing and a Standardized Quality Test for the FEG Electron Microscope"; Elsevier Science B.V; Ultramicroscopy; vol. 58; pp. 97-103; (1995).

C. Gatel et al.; "Dynamical Holographic Moires in a TEM"; IOP Publishing; Journal of Physics D: Applied Physics; vol. 49; pp. 1-10; (2016).

Vadim Migunov et al.; "Prospects for Quantitative and Time-Resolved Double and Continuous Exposure Off-Axis Electron Holography"; Ultramicroscopy; Aug. 16, 2016; pp. 1-18.

T. Niermann et al.; "Averaging Scheme for Atomic Resolution Off-Axis Electron Holograms"; Elsevier; Micron (2014); pp. 1-7.

Edgar Volkl et al.; "Introduction to Electron Holography" Springer Science & Business Media, LLC (1999); 362 pages.

G. Matteucci et al.; "Electron Holography of Long-Range Electrostatic Field"; Advances in Imaging and Electron Physics; vol. 99; Academic Press Inc.; pp. 171-240; (1998).

S. Petitgrand et al.; "3D Measurement of Micromechanical Devices Vibration Mode Shapes with a Stroboscopic Interferometric Microscope"; Elsevier; Optics and Lasers in Engineering; vol. 36; pp. 77-101; (2001) XP-002574894.

B.W. Reed et al.; "The Evolution of Ultrafast Electron Microscope Instrumentation"; Microscopy and Microanalysis; vol. 15; pp. 272-281; (2009); XP-001523798.

International Search Report dated Jun. 8, 2018 issued in International Patent Application No. PCT/EP2018/054806 filed Feb. 27, 2018.

European Search Report dated Sep. 22, 2017 issued in European Patent Application No. 17160812.8; filed Mar. 14, 2017.

\* cited by examiner

METHOD AND APPARATUS FOR CARRYING OUT A TIME-RESOLVED INTERFEROMETRIC MEASUREMENT

BACKGROUND OF THE INVENTION

The invention inter alia relates to a method for carrying out a time-resolved interferometric measurement comprising the steps of generating at least two coherent waves, overlapping said at least two coherent waves and producing an interference pattern, measuring the interference pattern for a given exposure time, thereby forming measured interference values, and analyzing the measured interference values and extracting amplitude and/or phase information from the measured interference values.

It is known in the art that a method as described above may be used in transmission electron microscopy systems, for instance. Transmission electron microscopy is a key method for the understanding of materials on the nanoscale, as it grants access to structural or atomic causes of macroscopic observations. Electron holography (EH) even deepens this microscopic insight, as it directly measures the associated electric and magnetic fields with the same spatial resolution. So far, EH is limited to static specimen. The extension to dynamic processes is challenging, as the time-resolution of EH is limited by relatively long exposure times (typically in the seconds range), which are needed to obtain data well above noise.

OBJECTIVE OF THE PRESENT INVENTION

An objective of the present invention is to provide a method and apparatus for carrying out a time-resolved interferometric measurement with increased time-resolution despite constraints imposed by relatively long exposure times.

BRIEF SUMMARY OF THE INVENTION

An embodiment of the invention relates to a method for carrying out a time-resolved interferometric measurement comprising the steps of
  generating at least two coherent waves,
  overlapping said at least two coherent waves and producing an interference pattern,
  measuring the interference pattern for a given exposure time, thereby forming measured interference values, and
  analyzing the measured interference values and extracting amplitude and/or phase information from the measured interference values,
  wherein
  in at least one time segment, hereinafter referred to as disturbed time segment, of the exposure time, the interference pattern is intentionally disturbed or destroyed such that the corresponding measured interference values describe a disturbed or destroyed interference pattern,
  in at least one other time segment, hereinafter referred to as undisturbed time segment, of the exposure time, the interference pattern is undisturbed or at least less disturbed compared to the disturbed time segment such that the corresponding measured interference values describe an undisturbed or less disturbed interference pattern,
  the measured interference values that were measured during the entire given exposure time, are filtered, wherein those interference values that were measured during the at least one disturbed time segment, are reduced, suppressed or discarded, and
  the filtered interference values are analyzed and the amplitude and/or phase information is extracted from the filtered interference values.

According to this embodiment, the exposure time is divided into a at least one disturbed time segment and at least one undisturbed disturbed time segment. By filtering the information that is related to the at least one undisturbed disturbed time segment, the sought-after amplitude and/or phase information solely relates to the at least one undisturbed disturbed time segment which is smaller than the entire given exposure time. Therefore the resulting time-resolution is smaller than the exposure time.

In the at least one disturbed time segment, the interference pattern may be disturbed or destroyed by shifting the wave fronts of the coherent waves relative to each other. Alternatively or additionally, the interference pattern may be disturbed or destroyed by tilting the coherent waves relative to each other. The shifting and/or tilting may be carried out in a continuous fashion.

Said step of filtering the measured interference values is preferably carried out in the Fourier space and comprises:
  subjecting the sequence of interference values that were measured during the entire given exposure time, to a Fourier analysis and calculating transformed values in the Fourier space,
  selecting one side band of the transformed values in the Fourier space, and
  subjecting the transformed values of the selected side band to an inverse Fourier analysis and thereby forming the filtered interference values.

The coherent waves are preferably overlapped by an overlap device. The overlap device may be a biprism.

During the at least one disturbed time segment, a noise signal is preferably applied to the overlap device. The noise signal may be a white noise signal.

The biprism preferably comprises a filament that is on a first electrostatic potential and bracketed by two counter electrodes. The two counter electrodes are preferably on electrostatic potentials that are different from the first electrostatic potential. The noise signal is preferably applied to the filament.

The method described above can be used in electron holography systems where the required exposure times are quite long (typically in the range of a few seconds) in order to increase the time-resolution. The time-resolution will be determined by the duration of the undisturbed time segments, only.

Alternatively, other types of coherent waves such as, for instance, coherent electromagnetic waves, coherent pressure waves (e.g. coherent acoustic or water waves) or other types of coherent particle waves may be used to generate the interference pattern.

A further embodiment of the present invention relates to an apparatus for carrying out a time-resolved interferometric measurement comprising
  a source for generating at least two coherent waves,
  an overlap device for overlapping said at least two coherent waves and for producing an interference pattern,
  a measurement device for measuring the interference pattern for a given exposure time, thereby forming measured interference values, and
  an analyzer for analyzing the measured interference values and extracting amplitude and/or phase information from the measured interference values, wherein the apparatus comprises a temporal interference switch or gate which is configured
to disturb or destroy the interference pattern in at least one time segment, hereinafter referred to as disturbed time segment, of the given exposure time such that the corresponding measured interference values describe a disturbed or destroyed interference pattern, and
to disturb the interference pattern less or leave it undisturbed in at least one other time segment, hereinafter referred to as undisturbed time segment, such that the corresponding measured interference values describe an undisturbed or less disturbed interference pattern, and
wherein the analyzer is configured to filter the measured interference values that were measured during the entire given exposure time, wherein those interference values that were measured during the at least one disturbed time segment, are reduced, suppressed or discarded, and to analyze the filtered interference values in order to extract the amplitude and/or phase information from the filtered interference values.

By dividing the exposure time into at least one disturbed time segment and at least one undisturbed disturbed time segment and by filtering the information that is related to the at least one undisturbed disturbed time segment, the sought-after amplitude and/or phase information may be restricted to the at least one undisturbed time segment which is smaller than the entire exposure time. As such, the time-resolution is disentangled from the exposure time.

The apparatus may be an electron holography system.

The temporal interference switch or gate preferably comprises a noise generator which is connected with the overlap device and configured to apply a noise signal to the overlap device during the at least one disturbed time segment.

The analyzer preferably comprises
a Fourier unit configured to subject the sequence of interference values that were measured during the entire given exposure time, to a Fourier analysis and to calculate transformed values in the Fourier space,
a Fourier space filter unit configured to select one side band of the transformed values in the Fourier space, and
an inverse Fourier unit configured to subject the transformed values of the selected side band to an inverse Fourier analysis and thereby form the filtered interference values.

BRIEF DESCRIPTION OF THE DRAWINGS

In order that the manner, in which the above-recited and other advantages of the invention are obtained, will be readily understood, a more particular description of the invention briefly described above will be rendered by reference to a specific embodiment thereof, which is illustrated in the appended figures. Understanding that these figures depict only a typical embodiment of the invention and is therefore not to be considered to be limiting of its scope, the invention will be described and explained with additional specificity and detail by the use of the accompanying drawings in which.

DETAILED DESCRIPTION OF A PREFERRED EMBODIMENT

A preferred embodiment of the present invention will be best understood by reference to the drawings, wherein identical or comparable parts are designated by the same reference signs throughout.

The following more detailed description of the exemplary embodiment is not intended to limit the scope of the invention, but is merely representative of a presently preferred embodiment of the invention. For instance, the present invention is not limited to electron holography systems as described hereinafter in further detail. The present invention may also be used in systems which are based on or use other types of coherent waves such as, for instance, coherent electromagnetic waves, coherent pressure waves (e.g. coherent acoustic or water waves) or other types of coherent particle waves.

Figure 1:
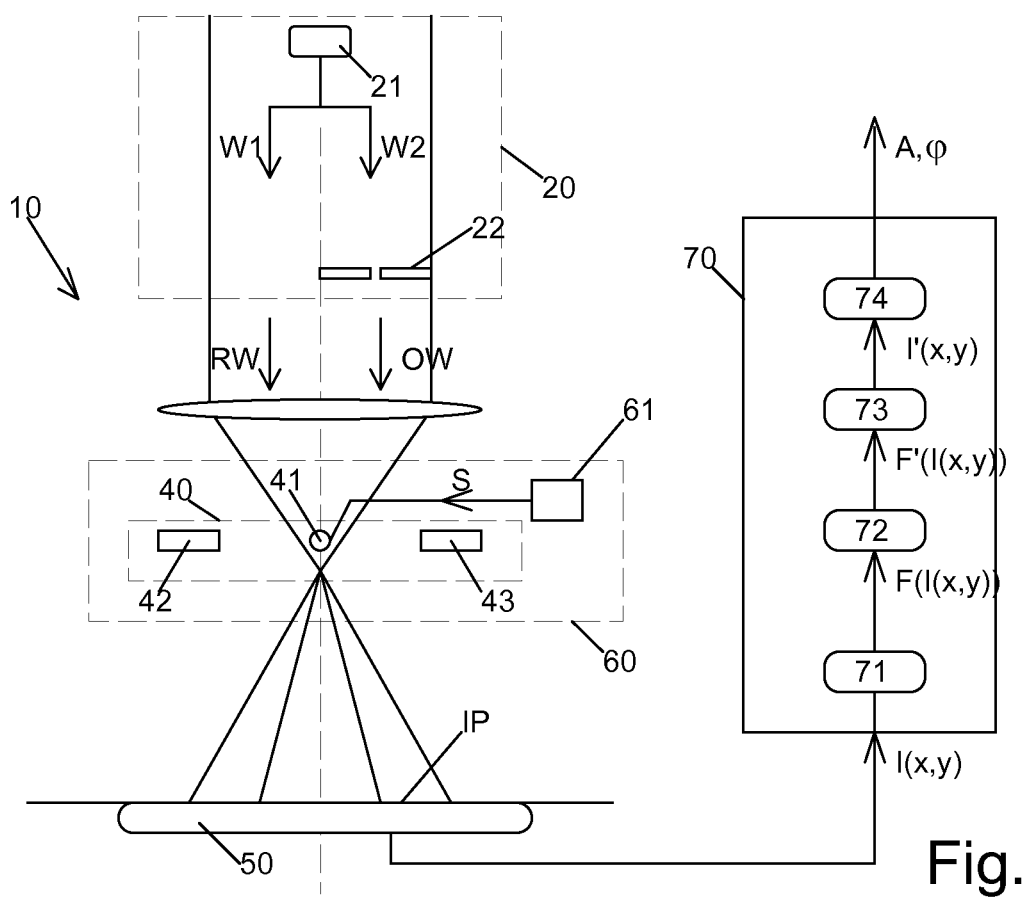
FIG. 1 shows an exemplary embodiment of an electron holography system.

FIG. 1 shows an exemplary embodiment of an apparatus 10 for time-resolved interferometric measurements. The apparatus 10 may form or be comprised by an electron holography system.

The apparatus 10 comprises a source 20 for generating two coherent electron waves, which are hereinafter referred to as reference wave RW and object wave OW. The source 20 comprises an electron emitter 21 which emits a first partial electron wave W1 and a second partial electron wave W2. The first partial electron wave W1 is transmitted through vacuum and forms the reference wave RW. The second partial electron wave W2, which is coherent with the first partial electron wave W1, passes an object 22 and forms the object wave OW.

The reference wave RW and the object wave OW passes an objective 30 and an overlap device 40. The overlap device 40 overlaps the reference wave RW and the object wave OW and produces an interference pattern IP that is measured by a measurement device 50. Each measurement cycle lasts a given exposure time T and generates measured interference values I(x,y) in case of a two-dimensional interference pattern.

In the exemplary embodiment of FIG. 1, the overlap device 40 is a biprism comprising a filament 41 that is bracketed by two counter electrodes 42 and 43. The filament 41 is on a first electrostatic potential. The two counter electrodes 42 and 43 are on electrostatic potentials that are different from the first electrostatic potential. For instance, the two counter electrodes 42 and 43 can be on ground potential, whereas the first electrostatic potential may be positive potential relative to ground potential.

The apparatus 10 further comprises a temporal interference switch or gate 60. The temporal interference switch or gate 60 disturbs or destroys the interference pattern IP in at least one time segment, hereinafter referred to as disturbed time segment [0, t1] (see FIG. 2), of the given exposure time T such that the corresponding measured interference values I(x,y) describe a disturbed or destroyed interference pattern IP.

In at least one other time segment, hereinafter referred to as undisturbed time segment [t1, t2] (see FIG. 2), the temporal interference switch or gate 60 disturbs the interference pattern IP less or leaves it undisturbed.

Figure 2:
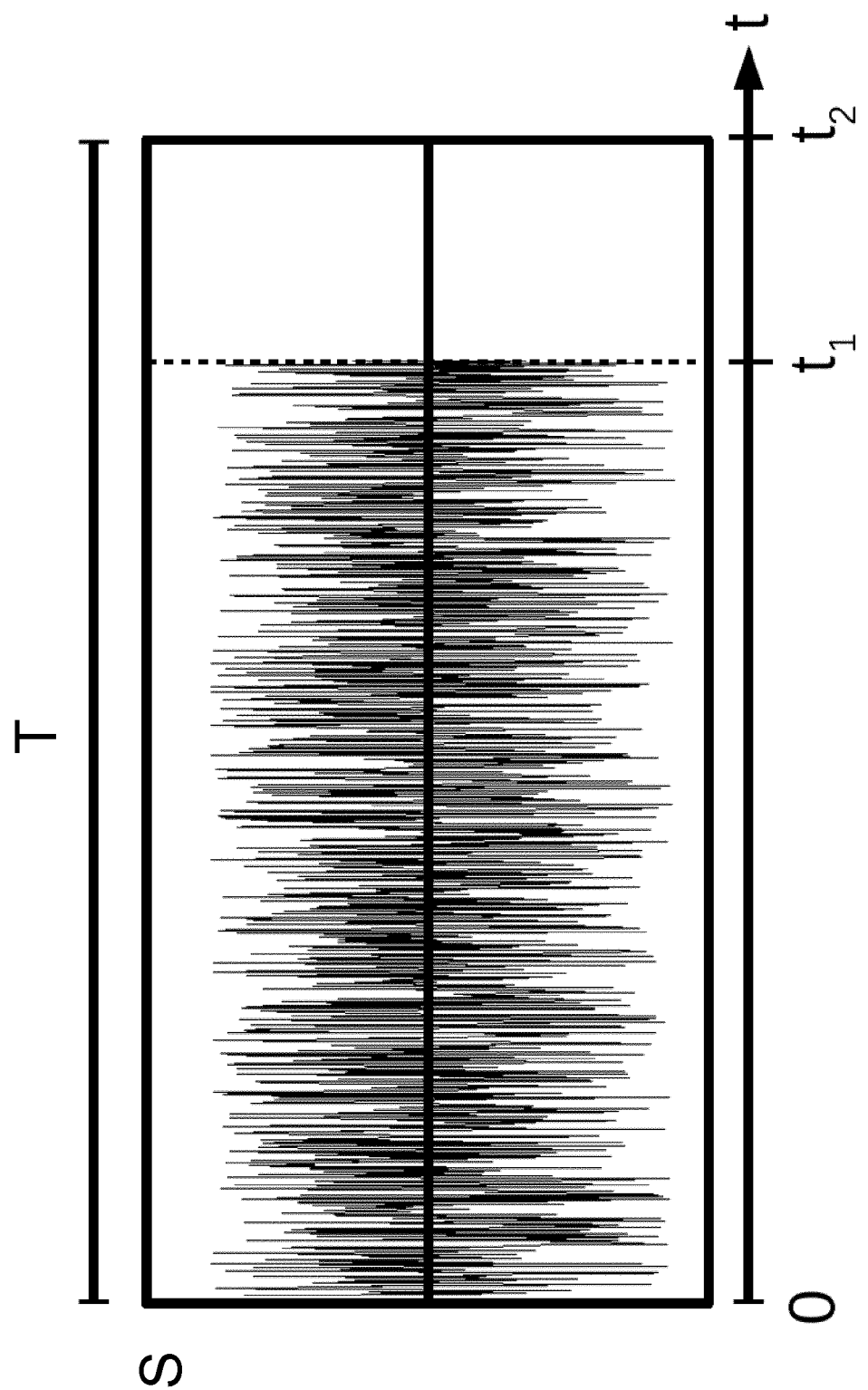
FIG. 2 shows an exemplary control signal that may be used to control an overlap device of the electron holography system of FIG. 1.

For instance, the temporal interference switch or gate 60 may be a mechanical device which mechanically moves the apparatus or parts thereof and thereby influences the interference pattern IP mechanically. In the embodiment of FIG. 1, the temporal interference switch or gate 60 is formed by the overlap device 40 and a noise generator 61 which controls the overlap device 40 via a control signal S. The control signal S may be a voltage signal that modulates the electric potential of the filament 41. The control signal S is depicted in FIG. 2 versus time in an exemplary fashion.

During the disturbed time segments [0, t1] (see FIG. 2) of the given exposure time T, the noise generator 61 applies an electric noise signal to the filament 41 such that the electrostatic potential of the filament is unstable and the overlap functionality of the biprism is jeopardized.

During the undisturbed time segments [t1, t2] (see FIG. 2) of the given exposure time T, the noise generator does not apply noise to the filament 41 and the biprism can overlap the waves RW and OW and generate the interference pattern IP in the usual way.

Furthermore, the apparatus 10 comprises an analyzer 70 for analyzing the measured interference values I(x,y) and extracting amplitude and/or phase information from the measured interference values I(x,y). To this end, the analyzer according to the exemplary embodiment of FIG. 1 comprises a Fourier unit 71, a Fourier space filter unit 72, an inverse Fourier unit 73 and an extraction unit 74.

The Fourier unit 71 subjects the sequence of interference values I(x,y) that were measured during the entire given exposure time T, to a Fourier analysis and calculates transformed values F(I(x,y)) in the Fourier space.

Figure 3:
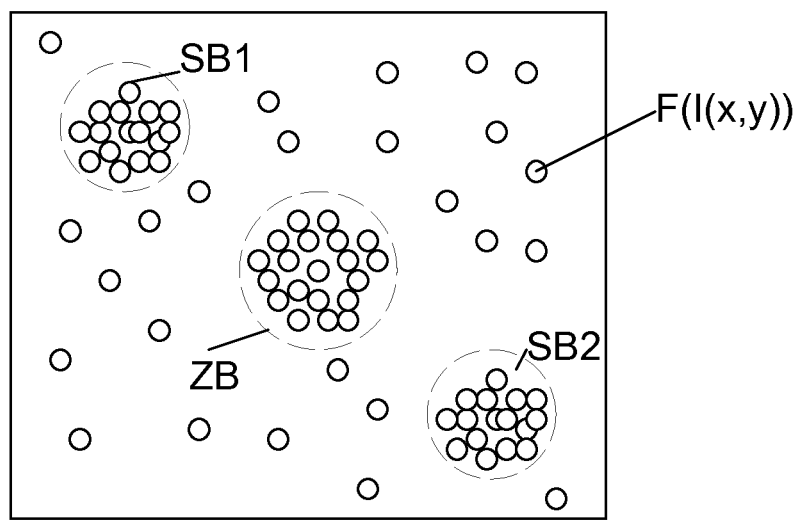
FIG. 3 shows an exemplary distribution of transformed measured interference values in the Fourier space.

FIG. 3 shows an exemplary distribution of the transformed values F(I(x,y)) in the Fourier space. The transformed values F(I(x,y)) form two side bands SB1 and SB2 in the Fourier space. The two side bands SB1 and SB2 are arranged symmetrically with respect to a central band ZB. The two side bands SB1 and SB2 correspond to the undisturbed time segment [t1, t2] (see FIG. 2), in which the temporal interference switch or gate 60 does not destroy the interference pattern IP. In contrast, the other areas outside the sidebands SB1 and SB2 are influenced by the noise which is applied to the filament 61 during the disturbed time segment [0, t1].

The Fourier space filter unit 72 selects one of the side bands SB1 or SB2 of the transformed values in the Fourier space. The selection may be based on image recognition methods or neural networks known in the art.

Figure 4:
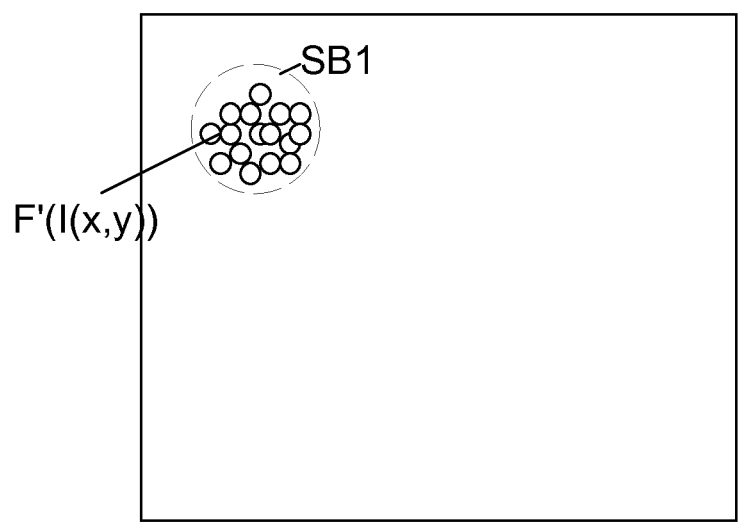
FIG. 4 shows the transformed interference values of FIG. 3 after selecting a single sideband in the Fourier space.

FIG. 4 shows the selected side band SB1 in the Fourier space after the selection process. In FIGS. 1 and 4, the transformed values of the selected side band SB1 are designated by reference numeral F'(I(x,y)). The selection of the side band SB1 corresponds to filtering the measured interference values that were measured during the entire given exposure time T, wherein those interference values that were measured during the disturbed time segment [0, t1] are reduced, suppressed or discarded.

The inverse Fourier unit 73 subjects the transformed values F'(I(x,y)) of the selected side band SB1 to an inverse Fourier analysis and thereby forms filtered interference values I'(x,y).

The extraction unit 74 extracts amplitude and/or phase information A, φ from the filtered interference values I'(x,y). The extracted values A and φ may be calculated as follows:

$$A = |I'(x,y)|$$

$$\varphi = \arg(I'(x,y))$$

As already emphasized above in the introductory part, the present invention is not limited to electron holography systems. The present invention may also be used in systems which are based on other types of coherent waves such as, for instance, coherent electromagnetic waves, coherent pressure waves (e.g. coherent acoustic or water waves) or other types of coherent particle waves.

The invention claimed is:

1. Method for carrying out a time-resolved interferometric measurement comprising the steps of
generating at least two coherent waves (OW, RW),
overlapping said at least two coherent waves (OW, RW) and producing an interference pattern (IP),
measuring the interference pattern (IP) for a given exposure time (T), thereby forming measured interference values (I(x,y)), and
analyzing the measured interference values (I(x,y)) and extracting amplitude and/or phase information from the measured interference values (I(x,y)),
characterized in that
in at least one time segment of the exposure time (T), the interference pattern (IP) is intentionally disturbed or destroyed such that the corresponding measured interference values (I(x,y)) describe a disturbed or destroyed interference pattern (IP),
in at least one other time segment, of the exposure time (T), the interference pattern (IP) is undisturbed or at least less disturbed compared to the disturbed time segment ([0, t1]) such that the corresponding measured interference values (I(x,y)) describe an undisturbed or less disturbed interference pattern (IP),
the measured interference values (I(x,y)) that were measured during the entire given exposure time (T), are filtered, wherein the measured interference values (I(x,y)) that were measured during the at least one disturbed time segment ([0, t1]), are reduced, suppressed or discarded, and
the filtered interference values (I'(x,y)) are analyzed and the amplitude and/or phase information is extracted from the filtered interference values (I'(x,y)).

2. Method according to claim 1 wherein in the at least one disturbed time segment ([0, t1]), the interference pattern (IP) is disturbed or destroyed by shifting wave fronts of said at least two coherent waves (OW, RW) relative to each other.

3. Method according to claim 1 wherein in the at least one disturbed time segment ([0, t1]), the interference pattern (IP) is disturbed or destroyed by tilting said at least two coherent waves (OW, RW) relative to each other.

4. Method according to claim 1 further comprising the step of filtering the measured interference values (I(x,y)) carried out in the Fourier space and, wherein the step of filtering comprises:
subjecting the sequence of interference values (I(x,y)) that were measured during the entire given exposure time (T), to a Fourier analysis and calculating transformed values (F(I(x,y))) in the Fourier space,
selecting one side band (SB1) of the transformed values (F(I(x,y))) in the Fourier space, and
subjecting the transformed values (F'(I(x,y))) of the selected side band (SB1) to an inverse Fourier analysis and thereby forming the filtered interference values (I'(x,y)).

5. Method according to claim 1 wherein said at least two coherent waves (OW, RW) are overlapped by an overlap device (40).

6. Method according to claim 5 wherein the overlap device (40) is a biprism.

7. Method according to claim 5 wherein, during the at least one disturbed time segment ([0, t1]), a noise signal is applied to the overlap device (40).

8. Method according to claim 7 wherein the noise signal is a white noise signal.

9. Method according to claim 8 wherein the overlap device is a biprism and the biprism comprises a filament (41) that is on a first electrostatic potential and bracketed by two counter electrodes (42, 43), wherein the two counter electrodes (42, 43) are on electrostatic potentials that are different from the first electrostatic potential, and wherein the noise signal is applied to the filament (41).

10. Method according to claim 1 wherein said at least two coherent waves (OW, RW) are coherent electron waves (OW, RW).

11. Apparatus (10) for carrying out a time-resolved interferometric measurement comprising a source (20) for generating at least two coherent waves (OW, RW), an overlap device (40) for overlapping said at least two coherent waves (OW, RW) and for producing an interference pattern (IP), a measurement device (50) for measuring the interference pattern (IP) for a given exposure time (T), thereby forming measured interference values (I(x,y)), and an analyzer (70) for analyzing the measured interference values (I(x,y)) and extracting amplitude and/or phase information from the measured interference values (I(x,y)), characterized in that the apparatus (10) comprises a temporal interference switch or gate (60) which is configured to disturb or destroy the interference pattern (IP) in at least one time segment of the given exposure time (T) such that the corresponding measured interference values (I(x,y)) describe a disturbed or destroyed interference pattern (IP), and to disturb the interference pattern (IP) less or leave it undisturbed in at least one other time segment such that the corresponding measured interference values (I(x,y)) describe an undisturbed or less disturbed interference pattern (IP), and the analyzer (70) is configured to filter the measured interference values (I(x,y)) that were measured during the entire given exposure time (T), wherein the measured interference values (I(x,y)) that were measured during the at least one disturbed time segment ([0, t1]), are reduced, suppressed or discarded, and to analyze the filtered interference values (I'(x,y)) in order to extract the amplitude and/or phase information from the filtered interference values (I'(x,y)).

12. Apparatus (10) according to claim 11 wherein the apparatus is an electron holography system.

13. Apparatus (10) according to claim 11 wherein the temporal interference switch or gate (60) comprises a noise generator (61) which is connected with the overlap device (40) and configured to apply a noise signal to the overlap device (40) during the at least one disturbed time segment ([0, t1]).

14. Apparatus (10) according to claim 11 wherein the analyzer (70) comprises a Fourier unit (71) configured to subject the sequence of interference values (I(x,y)) that were measured during the entire given exposure time (T), to a Fourier analysis and to calculate transformed values (F(I(x,y))) in the Fourier space, a Fourier space filter unit (72) configured to select one side band (SB1) of the transformed values (F(I(x,y))) in the Fourier space, an inverse Fourier unit (73) configured to subject the transformed values (F(I(x,y))) of the selected side band (SB1) to an inverse Fourier analysis and thereby form the filtered interference values (I'(x,y)).

* * * * *